(12) United States Patent
Danks (10) Patent No.: US 9,802,364 B2
(45) Date of Patent: Oct. 31, 2017

(54) SYSTEMS AND METHODS FOR CONSTRUCTION OF AN INSTRUCTION SET FOR THREE-DIMENSIONAL PRINTING OF A USER-CUSTOMIZABLEIMAGE OF A THREE-DIMENSIONAL STRUCTURE

(71) Applicant: 3D Systems, Inc., Rock Hill, SC (US)

(72) Inventor: Mark Edward Danks, Berkeley, CA (US)

(73) Assignee: 3D Systems, Inc., Rock Hill, SC (US)

( * ) Notice: Subject to any disclaimer, the term of this patent is extended or adjusted under 35 U.S.C. 154(b) by 1108 days.

(21) Appl. No.: 13/654,578

(22) Filed: Oct. 18, 2012

(65) Prior Publication Data

US 2013/0096708 A1 Apr. 18, 2013

Related U.S. Application Data

(60) Provisional application No. 61/548,541, filed on Oct. 18, 2011.

(51) Int. Cl.
| | | |
|---|---|---|
| *G06F 19/00* | (2011.01) |
| *B29C 67/00* | (2017.01) |
| *B29C 64/386* | (2017.01) |
| *B33Y 50/00* | (2015.01) |

(Continued)

(52) U.S. Cl.
CPC ........ *B29C 67/0088* (2013.01); *B29C 64/386* (2017.08); *B33Y 50/00* (2014.12); *B33Y 50/02* (2014.12); *G06F 17/50* (2013.01)

(58) Field of Classification Search
CPC ...... G05B 19/40; G05B 2219/00; B44B 3/00; B29C 67/00; B23K 26/38; G09F 1/06; G06T 17/00; G06K 9/00; G09G 5/00; G06F 15/00; G06F 17/50; B31B 1/88

USPC ...... 700/98, 118, 159, 160, 193; 382/10, 23, 382/15; 380/21, 28, 54; 493/35, 32, 94, 493/95; 345/41–42, 44, 61–63; 283/2, 4, (Continued)

(56) References Cited

U.S. PATENT DOCUMENTS

| | | |
|---|---|---|
| 3,944,798 A | 3/1976 | Eaton |
| 4,062,455 A | 12/1977 | Flatau |
| 4,216,467 A | 8/1980 | Colston |

(Continued)

FOREIGN PATENT DOCUMENTS

| | | |
|---|---|---|
| GB | 2389764 | 12/2003 |
| GB | 2410351 | 7/2005 |

(Continued)

OTHER PUBLICATIONS

Altmann, "About Nonunifirm Rational B-Splines—NURBS," http://web.cs.wpl.edu/~matt/courses/cs563/talks/nurbs.html; printed Oct. 30, 2012, 6 pgs.

(Continued)

*Primary Examiner* — Mohammad Ali
*Assistant Examiner* — Md Azad (57) ABSTRACT

Systems and methods for construction of an instruction set for three-dimensional printing of a user-customizable image of a three-dimensional structure are provided. Methods can include receiving user input for customizing an image of a three-dimensional structure, control circuitry constructing an instruction set for the customized image of the three-dimensional structure, and control circuitry rendering the instruction set into a printable file usable by a three-dimensional printer.

18 Claims, 2 Drawing Sheets

(51) Int. Cl.
*B33Y 50/02* (2015.01)
*G06F 17/50* (2006.01)

(58) Field of Classification Search
USPC .............. 283/34; 219/12; 118/66–67; 40/12; 358/1
See application file for complete search history.

(56) References Cited

U.S. PATENT DOCUMENTS

| | | |
|---|---|---|
| 4,302,138 A | 11/1981 | Zarudiansky |
| 4,367,532 A | 1/1983 | Crum et al. |
| 4,420,808 A | 12/1983 | Diamond et al. |
| 4,521,685 A | 6/1985 | Rebman |
| 4,604,016 A | 8/1986 | Joyce |
| 4,632,341 A | 12/1986 | Repperger et al. |
| 4,638,798 A | 1/1987 | Shelden et al. |
| 4,653,011 A | 3/1987 | Iwano |
| 4,654,648 A | 3/1987 | Herrington et al. |
| 4,655,673 A | 4/1987 | Hawkes |
| 4,661,032 A | 4/1987 | Arai |
| 4,670,851 A | 6/1987 | Murakami et al. |
| 4,676,002 A | 6/1987 | Slocum |
| 4,680,519 A | 7/1987 | Chand et al. |
| 4,686,522 A | 8/1987 | Hernandez et al. |
| 4,703,443 A | 10/1987 | Moriyasu |
| 4,729,098 A | 3/1988 | Cline et al. |
| 4,769,763 A | 9/1988 | Trieb et al. |
| 4,791,934 A | 12/1988 | Brunnett |
| 4,795,296 A | 1/1989 | Jau |
| 4,800,721 A | 1/1989 | Cemenska et al. |
| 4,819,195 A | 4/1989 | Bell et al. |
| 4,823,634 A | 4/1989 | Culver |
| 4,837,734 A | 6/1989 | Ichikawa et al. |
| 4,839,838 A | 6/1989 | LaBiche et al. |
| 4,853,874 A | 8/1989 | Iwamoto et al. |
| 4,888,538 A | 12/1989 | Dimitrov et al. |
| 4,893,981 A | 1/1990 | Yoshinada et al. |
| 4,907,970 A | 3/1990 | Meenen, Jr. |
| 4,907,973 A | 3/1990 | Hon |
| 4,942,538 A | 7/1990 | Yuan et al. |
| 4,945,305 A | 7/1990 | Blood |
| 4,945,501 A | 7/1990 | Bell et al. |
| 4,961,138 A | 10/1990 | Gorniak |
| 4,973,111 A | 11/1990 | Haacke et al. |
| 4,973,215 A | 11/1990 | Karlen et al. |
| 4,982,504 A | 1/1991 | Soderberg et al. |
| 4,988,981 A | 1/1991 | Zimmerman et al. |
| 5,004,391 A | 4/1991 | Burdea |
| 5,007,300 A | 4/1991 | Siva |
| 5,018,922 A | 5/1991 | Yoshinada et al. |
| 5,019,761 A | 5/1991 | Kraft |
| 5,038,089 A | 8/1991 | Szakaly |
| 5,040,306 A | 8/1991 | McMurtry et al. |
| 5,044,956 A | 9/1991 | Behensky et al. |
| 5,053,975 A | 10/1991 | Tsuchihashi et al. |
| 5,072,361 A | 12/1991 | Davis et al. |
| 5,088,046 A | 2/1992 | McMurty |
| 5,088,055 A | 2/1992 | Oyama |
| 5,103,404 A | 4/1992 | McIntosh |
| 5,105,367 A | 4/1992 | Tsuchihashi et al. |
| 5,116,051 A | 5/1992 | Moncrief et al. |
| 5,116,180 A | 5/1992 | Fung et al. |
| 5,130,632 A | 7/1992 | Ezawa et al. |
| 5,131,844 A | 7/1992 | Marinaccio et al. |
| 5,142,931 A | 9/1992 | Menaham |
| 5,143,505 A | 9/1992 | Burdea et al. |
| 5,184,319 A | 2/1993 | Kramer |
| 5,185,561 A | 2/1993 | Good et al. |
| 5,189,806 A | 3/1993 | McMurtry et al. |
| 5,193,963 A | 3/1993 | McAffee et al. |
| 5,204,824 A | 4/1993 | Fujimaki |
| 5,220,260 A | 6/1993 | Schuler |
| 5,223,776 A | 6/1993 | Radke et al. |
| 5,237,647 A | 8/1993 | Roberts et al. |
| 5,239,246 A | 8/1993 | Kim |
| 5,255,211 A | 10/1993 | Redmond |
| 5,255,352 A | 10/1993 | Falk |
| 5,264,768 A | 11/1993 | Gregory et al. |
| 5,266,875 A | 11/1993 | Slotine et al. |
| 5,333,257 A | 7/1994 | Merrill et al. |
| 5,354,162 A | 10/1994 | Burdea et al. |
| 5,369,736 A | 11/1994 | Kato et al. |
| 5,371,778 A | 12/1994 | Yanof et al. |
| 5,382,885 A | 1/1995 | Salcudean et al. |
| 5,389,865 A | 2/1995 | Jacobus et al. |
| 5,396,265 A | 3/1995 | Ulrich et al. |
| 5,414,337 A | 5/1995 | Schuler |
| 5,429,140 A | 7/1995 | Burdea et al. |
| 5,438,529 A | 8/1995 | Rosenberg et al. |
| 5,446,834 A | 8/1995 | Deering |
| 5,459,382 A | 10/1995 | Jacobus et al. |
| 5,461,708 A | 10/1995 | Kahn |
| 5,482,051 A | 1/1996 | Reddy et al. |
| 5,489,830 A | 2/1996 | Fernandez |
| 5,497,452 A | 3/1996 | Shimizu et al. |
| 5,506,785 A | 4/1996 | Blank et al. |
| 5,515,078 A | 5/1996 | Greschler et al. |
| 5,555,894 A | 9/1996 | Doyama et al. |
| 5,559,412 A | 9/1996 | Schuler |
| 5,576,727 A | 11/1996 | Rosenberg et al. |
| 5,587,937 A | 12/1996 | Massie et al. |
| 5,589,854 A | 12/1996 | Tsai |
| D377,932 S | 2/1997 | Schena et al. |
| 5,623,582 A | 4/1997 | Rosenberg |
| 5,623,642 A | 4/1997 | Katz et al. |
| 5,625,576 A | 4/1997 | Massie et al. |
| 5,629,594 A | 5/1997 | Jacobus et al. |
| 5,642,469 A | 6/1997 | Hannaford et al. |
| 5,659,493 A | 8/1997 | Kiridena et al. |
| 5,666,138 A | 9/1997 | Culver |
| 5,691,898 A | 11/1997 | Rosenberg et al. |
| 5,694,013 A | 12/1997 | Stewart et al. |
| 5,701,140 A | 12/1997 | Rosenberg et al. |
| 5,721,566 A | 2/1998 | Rosenberg et al. |
| 5,724,264 A | 3/1998 | Rosenberg et al. |
| 5,731,804 A | 3/1998 | Rosenberg |
| 5,734,373 A | 3/1998 | Rosenberg et al. |
| 5,737,505 A | 4/1998 | Shaw et al. |
| 5,739,811 A | 4/1998 | Rosenberg et al. |
| 5,742,278 A | 4/1998 | Chen et al. |
| 5,751,289 A | 5/1998 | Myers |
| 5,754,023 A | 5/1998 | Roston et al. |
| 5,767,839 A | 6/1998 | Rosenberg |
| 5,769,640 A | 6/1998 | Jacobus et al. |
| 5,774,130 A | 6/1998 | Horikawa et al. |
| 5,784,542 A | 7/1998 | Ohm et al. |
| 5,790,108 A | 8/1998 | Salcudean et al. |
| 5,798,752 A | 8/1998 | Buxton et al. |
| 5,800,177 A | 9/1998 | Gillio |
| 5,800,178 A | 9/1998 | Gillio |
| 5,800,179 A | 9/1998 | Bailey |
| 5,802,353 A | 9/1998 | Avila et al. |
| 5,803,738 A | 9/1998 | Latham |
| 5,805,140 A | 9/1998 | Rosenberg et al. |
| 5,821,920 A | 10/1998 | Rosenberg et al. |
| 5,825,308 A | 10/1998 | Rosenberg |
| 5,828,197 A | 10/1998 | Martin et al. |
| 5,831,408 A | 11/1998 | Jacobus et al. |
| 5,844,392 A | 12/1998 | Peurach et al. |
| 5,847,956 A | 12/1998 | Bronfeld et al. |
| 5,859,934 A | 1/1999 | Green |
| 5,872,438 A | 2/1999 | Roston |
| 5,873,106 A | 2/1999 | Joseph |
| 5,880,714 A | 3/1999 | Rosenberg et al. |
| 5,881,178 A | 3/1999 | Tsykalov et al. |
| 5,882,206 A | 3/1999 | Gillio |
| 5,889,670 A | 3/1999 | Schuler et al. |
| 5,898,599 A | 4/1999 | Massie et al. |
| 5,903,270 A | 5/1999 | Gentry et al. |
| 5,903,886 A | 5/1999 | Heimlich et al. |
| 5,907,487 A | 5/1999 | Rosenberg et al. |
| 5,913,727 A | 6/1999 | Ahdoot |
| 5,929,607 A | 7/1999 | Rosenberg et al. |
| 5,929,846 A | 7/1999 | Rosenberg et al. |

(56) References Cited

U.S. PATENT DOCUMENTS

| | | | |
|---|---|---|---|
| 5,956,484 | A | 9/1999 | Rosenberg et al. |
| 5,963,212 | A | 10/1999 | Bakalash |
| 5,973,678 | A | 10/1999 | Stewart et al. |
| 5,988,862 | A | 11/1999 | Kacyra et al. |
| 6,040,840 | A | 3/2000 | Koshiba et al. |
| 6,061,004 | A | 5/2000 | Rosenberg |
| 6,064,394 | A | 5/2000 | Morrison |
| 6,084,587 | A | 7/2000 | Tarr et al. |
| 6,111,577 | A | 8/2000 | Zilles et al. |
| 6,131,097 | A | 10/2000 | Peurach et al. |
| 6,188,403 | B1 | 2/2001 | Sacerdoti et al. |
| 6,191,796 | B1 | 2/2001 | Tarr |
| 6,204,851 | B1 | 3/2001 | Netschke et al. |
| 6,211,848 | B1 | 4/2001 | Plesniak et al. |
| 6,219,032 | B1 | 4/2001 | Rosenberg et al. |
| 6,226,003 | B1 | 5/2001 | Akeley |
| 6,308,144 | B1 | 10/2001 | Bronfeld et al. |
| 6,337,678 | B1 | 1/2002 | Fish |
| 6,342,880 | B2 | 1/2002 | Rosenberg et al. |
| 6,369,834 | B1 | 4/2002 | Zilles et al. |
| 6,384,822 | B1 | 5/2002 | Bilodeau et al. |
| 6,405,158 | B1 | 6/2002 | Massie et al. |
| 6,417,638 | B1 | 7/2002 | Guy et al. |
| 6,421,048 | B1 | 7/2002 | Shih et al. |
| 6,552,722 | B1 | 4/2003 | Shih et al. |
| 6,608,631 | B1 | 8/2003 | Milliron |
| 6,671,651 | B2 | 12/2003 | Goodwin et al. |
| 6,707,458 | B1 | 3/2004 | Leather et al. |
| 6,792,398 | B1 | 9/2004 | Handley et al. |
| 6,822,635 | B2 | 11/2004 | Shahoian et al. |
| 6,831,640 | B2 | 12/2004 | Shih et al. |
| 6,853,965 | B2 | 2/2005 | Massie et al. |
| 6,867,770 | B2 | 3/2005 | Payne |
| 6,879,315 | B2 | 4/2005 | Guy et al. |
| D510,739 | S | 10/2005 | Jones et al. |
| 6,958,752 | B2 | 10/2005 | Jennings, Jr. et al. |
| 6,970,174 | B2 | 11/2005 | Fujiwara et al. |
| 6,985,133 | B1 | 1/2006 | Rodomista et al. |
| 7,236,178 | B2 | 6/2007 | Maillot et al. |
| 7,864,173 | B2 | 1/2011 | Handley et al. |
| 7,889,209 | B2 | 2/2011 | Berger et al. |
| 8,040,345 | B2 | 10/2011 | Faken et al. |
| 8,174,535 | B2 | 5/2012 | Berger et al. |
| 8,237,710 | B1 | 8/2012 | Marketsmueller et al. |
| 2002/0154132 | A1 | 10/2002 | Dumesny et al. |
| 2003/0191554 | A1 | 10/2003 | Russell et al. |
| 2005/0060130 | A1 | 3/2005 | Shapiro et al. |
| 2005/0168460 | A1 | 8/2005 | Razdan et al. |
| 2006/0052892 | A1* | 3/2006 | Matsushima et al. ......... 700/98 |
| 2006/0212150 | A1* | 9/2006 | Sims, Jr. ......................... 700/98 |
| 2009/0284528 | A1* | 11/2009 | Jensen et al. ................. 345/420 |
| 2012/0224755 | A1* | 9/2012 | Wu .............................. 382/131 |

FOREIGN PATENT DOCUMENTS

| | | |
|---|---|---|
| WO | WO 95/02801 | 1/1995 |
| WO | WO 96/16397 | 5/1996 |
| WO | WO 96/22591 | 7/1996 |
| WO | WO 96/42078 | 12/1996 |
| WO | WO 97/06410 | 2/1997 |
| WO | WO 97/12337 | 4/1997 |
| WO | WO 97/12357 | 4/1997 |
| WO | WO 97/19440 | 5/1997 |
| WO | WO 97/21160 | 6/1997 |
| WO | WO 97/44775 | 11/1997 |
| WO | WO 98/06024 | 2/1998 |
| WO | WO 98/26342 | 6/1998 |
| WO | WO 98/30951 | 7/1998 |
| WO | WO 98/58308 | 12/1998 |
| WO | WO 98/58323 | 12/1998 |
| WO | WO 99/10872 | 3/1999 |

OTHER PUBLICATIONS

Bentley, "Rendering Cubic Bezier Patches," Worcester Polytechnic Institute, http://web.cs.wpl.edu/~matt/courses/cs563/talks/surface/bez_surf.html; printed Oct. 30, 2012, 10 pgs.
Birn, "How to Model a Hairy Hippo Nose in Softimage 3D," http://www.3drender.com/jbirn/hippo/hairyhipponose.html; printed Oct. 30, 2012, 3 pgs.
Birn, "Softimage's Surface Continuity Manager," http://www.3drender.com/ncf/index.html; printed Oct. 30, 2012, 2 pgs.
Birn, "Tutorial: NURBS Head Modeling," http://www.3drender.com/jbirn/ea/HeadModel.html; printed Oct. 30, 2012, 5 pgs.
Blinn, "Simulation of Wrinkled Surfaces," Computer Graphics, vol. 12-3, pp. 286-292.
Galyean, "Sculpting: An Interactive Volumetric Modeling Technique," Computer Graphics (SIGGRAPH '91 Las Vegas), vol. 25, No. 4, pp. 267-274 (Jul. 1991).
Jay Arraich's Photoshop Tips, "7 Quick Mask," http://garymgordon.com/misc/tutorials/photoshop...tutorial/ref/aatool_quick_mask6.htm, printed Oct. 30, 2012, 3 pgs.
Math Forum, What is a Tessellation?, http://mathforum.org/sum95/suzanne/whattess.html, printed Oct. 30, 2012, 4 pgs.
Math World, "Conformal Mapping," http://mathworld.wolfram.com/ConformalMapping.html printed Oct. 30, 2012, 3 pgs.
Miller et al., "the Design of 3D Haptic Widgets," Proceedings of the 1999 Symposium on Interactive 3D Graphics Conference Proceedings (1999) pp. 1-6.
Minsky et al., "Feeling and Seeing: Issues in Force Display," Computer Graphics, vol. 24, No. 2, Mar. 1990, pp. 235-270.
"NURBS—Non-Uniform Rational B-Splines," http://www.aria.uklinux.net/nurbs.php3, printed Oct. 30, 2012, 4 pgs.
Rogers, "An Introduction to NURBS," Morgan Kaufmann Publishers, (2000), pp. 1-4.
Salisbury et al., "Haptic Rendering: Programming Touch Interaction With Virtual Objects," Presented and disseminated at the 1995 Symposium on Interactive 3D Graphics held Apr. 9-12, 1995 in Monterey, CA, sponsored by the Association for Computing Machinery, (ACM) and published by the ACM in Proceedings: 1995 Symposium on Interactive 3D Graphics, Monterey, California, Apr. 9-12, 1995, pp. 123-130.
Tensor product spline surfaces, http://www.ibiblio-org/e-notes/Splines/Inter.htm, 3 pgs.
Terzopoulos et al., "Elastically Deformable Models": Computer Graphics, vol. 21, No. 4, pp. 205-214, Jul. 1987.
"3D Animation Workshop: Lesson 39—Softimage—NURBS Blending," http://webreference.com/3d/lesson39/part3.html, Apr. 28, 1998.
"3D Animation Workshop: Lesson 65—Softimage—NURBS Blending," http://webreference.com/3d/lesson65, Apr. 28, 1999.
3D Animation Workshop: Lesson 66—Softimage—NURBS Blending, http://webreference.com/3d/lesson66, May 12, 1999.
3D Animation Workshop: Lesson 68—Softimage—NURBS Blending, http://webreference.com/3d/lesson68/, Jun. 8, 1999.
3D Animation Workshop: Lesson 69—Softimage—NURBS Blending, http://webreference.com/3d/lesson69/, Jun. 21, 1999.
3D Animation Workshop: Lesson 72—Softimage—NURBS Blending, http://webreference.com/3d/lesson72, Aug. 2, 1999.
Tyson, How Stuff Works, "How AGP Works," http://computer.howstuffworks.com/agp.htm/printable, printed Oct. 30, 2012.
Zilles, "Haptic Rendering with the Toolhandle Haptic Interface," Massachusetts Institute of Technology Master of Science Thesis, May 1995, pp. 1-46.
Joy, Kenneth I., "Catmull-Clark Surfaces," On-Line Geometric Modeling Notes, Computer Sciences Department, University of California, Davis, (c) 1996-1999.
"The Maya 4.5 Handbook (with CD-ROM) (GraphicsSeries)," Amazon.com citation pp. 1-5 (see "Product Details" for date of Dec. 31, 2002), http://www.amazon.com.
Staiger, Philip, "Tutorial—Getting Started With Amapi 4.1," Revised Jul. 7, 2003 (c) 2000 TGS, Inc. http://tgs.com via http://www.thebest3d.com/arnapi/tutorials/materialeditor/index.html, printed Oct. 30, 2012.

(56) References Cited

OTHER PUBLICATIONS

Piponi & Borshukov, Seamless Texture Mapping of Subdivision Surfaces by Model Pelting and Texture Blending, 8 pgs.

* cited by examiner

SYSTEMS AND METHODS FOR CONSTRUCTION OF AN INSTRUCTION SET FOR THREE-DIMENSIONAL PRINTING OF A USER-CUSTOMIZABLEIMAGE OF A THREE-DIMENSIONAL STRUCTURE

CLAIM OF PRIORITY

This application claims the benefit of priority under 35 U.S.C. §119(e) of U.S. Provisional Application Ser. No. 61/548,541, filed on Oct. 18, 2011, which application is incorporated by reference herein.

FIELD

The present invention relates generally to three-dimensional printing. More particularly, the present invention relates to systems and methods for construction of an instruction set for three-dimensional printing of a user-customizable image of a three-dimensional structure.

BACKGROUND

Three-dimensional printing is known in the art. For example, in three-dimensional printing, an image of a three-dimensional structure, for example, on a computer screen, can be printed in three-dimensions using a specially engineered composite material that starts out as a powder. A binding material can be added to the powder to solidify the powder particles together for creating the three-dimensional structure.

A three-dimensionally printed structure can be based on an image of a three-dimensional structure. For example, the image of the three-dimensional structure can be displayed on a computer screen using three-dimensional geometry. In some applications, the image can be customized, and in these applications, problems arise.

For example, when transitioning from an interactive computer rendering of a three-dimensional structure to a physical three-dimensional structure, the three-dimensional geometry that is used by an engine generating the image is different than geometry that is used by a printer printing the three-dimensional structure. Table 1 illustrates characteristics used by an engine generating image geometry and the conflicting characteristics used by a printer printing a three-dimensional geometry.

TABLE 1

| Characteristics Used by an Engine to Generate an Image | Characteristics Used by a Printer to Print Three-Dimensional Geometry |
| --- | --- |
| Low polygon (e.g., less than 10,000 triangles) | High polygon (e.g., greater than 500,000 triangles) |
| Only some geometry of a three-dimensional structure is displayed on a screen | Additional geometry can be needed in a three-dimensional structure, for example, end caps, not shown on a corresponding two-dimensional image |
| Low resolution textures (e.g., 128 × 128) | High resolution textures (1,000 × 1,000) |
| Fixed size on a screen | Three-dimensional geometry needs to match printing size |
| Users can save and edit customized shapes | Geometry is locked for printing |
| Size constraints when transmitting data | No constraints for data or storage |
| Hierarchical skeleton | Single solid piece of geometry |
| Normals calculated at run time | Normals must be in the geometry |

As seen in Table 1, geometry and textures that are used by an engine for generating an image of three-dimensional structure are different than geometry and textures that are used by a printer for printing a physical three-dimensional structure. However, the differences shown in Table 1 and others not specifically identified must be reconciled in some way to construct and print a three-dimensional structure based on the image.

SUMMARY

According to some embodiments, a method is provided. The method can include receiving user input data via a user interface device for customizing an image of a three-dimensional structure displayed on the user input device, control circuitry constructing an instruction set for the customized image of the three-dimensional structure, and control circuitry rendering the instruction set into a printable file usable by a three-dimensional printer.

A system including executable control software stored on a non-transitory computer readable medium and at least one programmable processor is also provided. The programmable processor can execute the methods described above and others in accordance with embodiments of the present invention.

DESCRIPTION OF THE PREFERRED EMBODIMENTS

While this invention is susceptible of embodiments in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments are described that include constructing a three-dimensional print-ready geometry from a user-customized shape. For example, in lieu of storing raw geometry and textures created by a user, an instruction set can be created, and the instruction set can be used to create a printable file for printing a three-dimensional structure based on an image of a three-dimensional structure displayed on a user interface, for example, a computer screen. By enabling the user to customize the three-dimensional structure that is stored as an instruction set, which references other objects that include geometries, textures, decals, indicia, and other designs that can be or are used during the user's customization of the three-dimensional structure, the user can change the design much more quickly. The user never sees the instruction set, but the instruction set recreates the image of a three-dimensional structure very quickly (for example, sixty times a second) such that the three-dimensional design viewed by the user appears to be updated instantaneously. The instruction set data size is significantly smaller than the three-dimensional structure (image or printable). In some embodiments of the present invention, the instruction set for a design for a three-dimensional structure may be on the order of 2 kilobytes whereas the print file for the same three-dimensional structure (such as an .obj file or other CAD file format) may be on the order of 20 megabytes. Accordingly, the user experience is significantly enhanced by eliminating wait times that are typically associated with prior art design software that must update a much larger file rather than the simplified instruction set. Moreover, certain embodiments of the present invention enable a third party who is printing the three-dimensional structure the ability to modify and recreate the print file (such as an .obj file) when a print fails. For example, if a user designs and orders a three-dimensional structure, but the third party printer discovers that a portion of the structure does not print properly, the third party printer can modify the referenced geometry(ies), texture(s), decal(s), or other designs to improve the printability of the three-dimensional structure and re-render (or re-convert or re-format) the instruction set into a printable file that is consistent with the user's design to print the three-dimensional structure desired by the user. Prior art techniques for third party printing typically do not enable the printer to change the print file without requiring the user to modify and reseed the print file. Yet another benefit of further embodiments of the present invention allows the textures, decals, indicia, and other designs to have the appropriate resolution for the size of the three-dimensional structure to be printed. For example, if the user orders a relatively small version of the three-dimensional structure, the automated conversion of the instruction set to the printable file may select relatively low resolution for certain textures (to provide example of one design referenced by the instruction set) that are consistent with the resolution of the three-dimensional printer, for example a ZPrinter 3D printer offered by the present assignee that prints color three-dimensional structures. Conversely, if the user orders a relatively large version of the three-dimensional structure, the automated conversion of the instruction set to the printable file may select relatively high resolution for certain textures (to provide the same example) to ensure that the printed texture is not pixilated or otherwise distorted. Still further benefits of enabling the user to design the three-dimensional structure using an instruction set and then convert the instruction set into a printable file only when the user has finalized the design are provided by further embodiments of the present invention.

Instruction sets are known in the art. For example, it is known to create an instruction set for an image and then to recreate the image using the instruction set. However, embodiments described herein can create an instruction set from geometry that is used by an engine to generate an image. Embodiments described herein can also render, that is, convert or format, the instruction set into a printable file that can be used by a printer to print a three-dimensional structure corresponding to the image.

Figure 1:
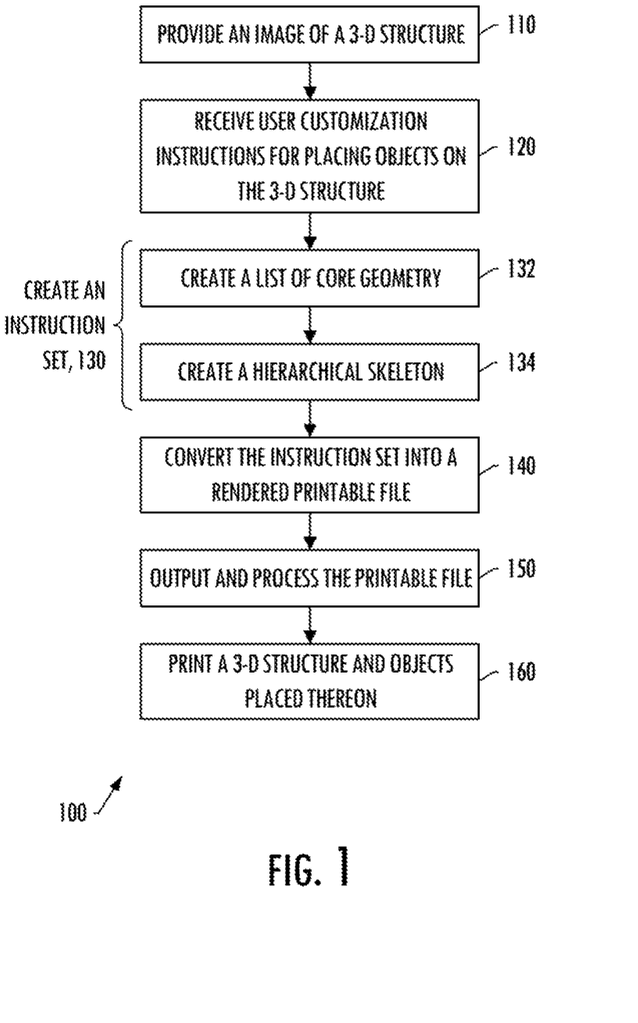
FIG. 1 is a flow diagram of a novel exemplary method for creating an instruction set for three-dimensionally printing a structure.
Figure 2:
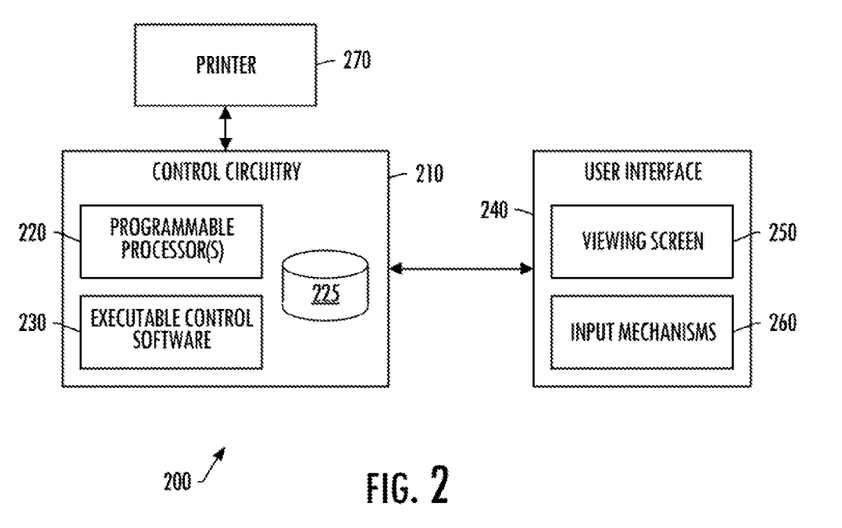
FIG. 2 is a block diagram of an exemplary system for executing the method of FIG. 1 and others in accordance with embodiments of the present invention.

FIG. 2 is a block diagram of a system 200 for carrying out the exemplary method 100 shown in FIG. 1 and others in accordance with embodiments of the present invention. As seen in FIG. 2, the system 200 can include control circuitry 210, one or more programmable processors 220, and executable control software 230 as would be understood by those of skill in the art. In some embodiments, the control circuitry 210 can include a memory device 225.

The executable control software 230 can implement the exemplary method described herein, for example, as illustrated in FIG. 1. The executable control software 230 can be stored on a transitory media or non-transitory computer readable medium including, but not limited to, local computer memory, RAM, optical storage media, magnetic storage media, flash memory, etc.

A printer 270, for example, a three-dimensional printer, can be in communication with the control circuitry 210. A user interface device 240 can also be in communication with the control circuitry 210.

A viewing screen 250 of the user interface device 240, as would be known by those of skill in the art, can display interactive and viewing windows. In some embodiments, the user interface device 240 can be a multi-dimensional graphical user interface, and in some embodiments, the user interface device 240 can include one or more input mechanisms 260, for example, a keypad or a mouse, for receiving user input.

According to some embodiments, an image of a three-dimensional structure can be shown on the viewing screen 250 of the user interface device 240, which can be, for example, on a personal computer. Users can customize the structure with objects, for example, decals, stamps, or other objects placed thereon. For example, users can provide customization instructions via the input mechanisms 260 of the user interface device. The viewing screen 250 can display to a user an image of the structure with the user customization, for example, objects placed on the structure.

The novel systems and methods described herein can construct an instruction set for use with three-dimensionally printing a structure corresponding to the user-customized image of the three-dimensional structure. The instruction set can be converted into a three-dimensional printable file that is sent to a three-dimensional printer 270.

For example, an engine in accordance with some embodiments, for example, the control circuitry 210, programmable processors 220, and executable control software 230, can create the instruction set that is converted into a printable file (that can be sent to the printer 270) based on the user-customized image of the three-dimensional structure. That is, the control circuitry 210, programmable processors 220, and executable control software 230 can create an instruction set from the geometry used to display the image of the structure and objects. Then, the control circuitry 210, programmable processors 220, and executable control software 230 can render, that is, convert or format, the instruction set into a printable file that identifies geometry that can be used by the printer 270.

In some embodiments, the control circuitry 210, programmable processors 220, and executable control software 230 can render the instruction set into a printable file that the printer 270 can use to print, in three dimensions, a structure with the user-customized objects thereon. The three-dimensional printer 270, as known in the art, can then print the three-dimensional structure and objects thereon using the three-dimensional printable file (such as an .obj or other CAD file format) rendered from the instruction set provided by the engine, for example, the control circuitry 210.

In some embodiments, an instruction set can include a plurality of different information. For example, the instruction set can include a list of core geometry of the user-customized image and a hierarchical skeleton.

The list of core geometry of the user-customized image can include the rotation, position, scale, and color values of the structure represented by the image, as well those same properties for any other structure, for example, background, etc., that is offset from the structure represented by the image.

The list of core geometry can also include a list of two-dimensional objects, for example, decals or stamps, that are placed on the structure represented by the image, including the rotation, position, scale, and color values of the objects. In accordance with some embodiments, at least the position and scale of the objects placed on the structure can be stored in a normalized UV space, which will be explained in more detail herein. In some embodiments, properties of the objects can be composited into properties of the structure at run time, that is, at the time when the printer 270 uses this information to three-dimensionally print a corresponding structure.

As explained above, the instruction set can also include a hierarchical skeleton. For example, the hierarchical skeleton can include the core geometry associated with image of the skeleton structure, that is, the structure before any user-customization and without any objects placed thereon. The hierarchical skeleton can also include rotation and position values of the skeleton structure and, in some embodiments, can be animated and/or posed at run time.

As explained above, in novel systems and methods described herein, at least the position and scale of user-customized objects placed on the image of the three-dimensional structure can be stored in a normalized UV space. It is to be understood that a UV space is space in which a two-dimensional image is mapped into a three-dimensional image or structure. For example, U and V axes can define a two-dimensional UV space, and X, Y, and Z axes can define a three-dimensional space.

U and V can be considered akin to X and Y. However, a UV space is only a texture space rather than in a geometrical space. But texture coordinates in a UV space can be used to map a two-dimensional image into a three-dimensional (X, Y, Z) space. The converse is also true. That is, an object in a three-dimensional space can be mapped into a UV space.

For example, in some embodiments, UV coordinates can represent a projection of a unit space vector with X, Y, and Z coordinates onto the XY plane. That is, U can be defined as follows:

$$U = \sin\Theta \cos\phi = X/\sqrt{(X^2+Y^2+Z^2)}$$

Similarly, V can be defined as follows:

$$V = \sin\Theta \sin\phi = Y/\sqrt{(X^2+Y^2+Z^2)}$$

According to some embodiments, a normalized UV space can mean that all positions and sizes are UV coordinates between (0-1, 0-1). This can be independent of actual object size and the final output texture of the three-dimensionally printed structure.

For example, if an object has a position of (0.5, 0.5) and a scale of (0.1, 0.1), the object can be placed in the middle (0.5) of an output texture and be scaled to $\frac{1}{10}$ (0.1) of the output texture when the instruction set is converted into a printable file that can be executed by the three-dimensional printer 270. Accordingly, for the same normalized position and scale, an object that is 50×50 would be placed at the center (500,500) of an output texture that is 1000×1000 and would be scaled from 50×50 to 100×100, i.e., $\frac{1}{10}$ of the output size. Therefore, use of a normalized UV space makes it easy to change out referenced geometries, objects, textures, decals, indicia, and other designs when the instruction set is being rendered into the printable file because the instruction set is not dependent upon the size of the referenced geometries, objects, textures, decals, indicia, and other designs. Other parameters of the object positioned on the normalized UV space can be recorded in the instruction set in addition to position and scale of the object, such as angular rotation, depth of texture, the sequence that textures or other objects were applied to enable overlapping, and other aspects of the geometries, objects, textures, decals, indicia, and other designs included by the user.

In accordance with the novel systems and methods described herein, because some properties associated with the user-customized objects are stored in a normalized UV space, the output textures of the objects can be at a high resolution. In some embodiments, the objects can be applied at a higher resolution than the objects used in the engine. However, regardless of the resolution, the overall ratios and locations of the objects to the structure can be consistent.

In accordance with a user interaction phase of some embodiments, as a user customizes the image of the three-dimensional structure in the engine, an instruction set can be created and continuously modified. For example, some embodiments can begin with an instruction set that includes geometry associated with an initial image of a three-dimensional structure. As the user customizes the image of the structure with objects, for example, decals or stamps, placed thereon, the instruction set can be updated with the geometry associated with the images of the objects. For example, the geometry associated with the images of the objects can be added to the list of geometry associated with the initial image. If the user deletes or modifies objects, the instruction set can be changed accordingly. By capturing the user deletions and modifications using the instruction set, some embodiments of the invention can include software can easily include "undo" and "redo" options that enable changes to be very quickly undone or redone as desired by the user.

In some embodiments, the instruction set can be modified after completion of the user interaction phase. For example, if the instruction set is a text file or is contained in a text file, systems and methods can modify the text file without any user-modification of the corresponding image. Thus, modifications to the instruction set need not be displayed on a user interface 240.

When the user is finished in the engine, i.e., when the user has finished customizing the structure with objects, the instruction set can be rendered, that is, converted or formatted. As explained above, novel systems and methods described herein can convert or format the instruction set into a three-dimensional printable file that identifies geometry that can be used by a printer to print a three-dimensional structure corresponding to the user-customized image. Thus, during a rendering phase, the instruction set is converted or formatted into a format (such as an .obj file) that can be accepted by a printer, for example, printer 270. In some embodiments, the rendering of the instruction set does not change the appearance of the three-dimensional structure to be printed. In further embodiments, the rendering of the instruction set corrects any abnormalities that may be included in the instruction set, such as intersecting geometries or areas that are not water-tight (as understood in the art), that would otherwise create print problems with the three-dimensional printer, but are instead converted into a printable file that can be used to print a three-dimensional structure that appears the same as the version of the instruction set seen as a three-dimensional structure by the user despite the presence of geometries that are problematic for three-dimensional printing.

In some embodiments, instead of displaying the instruction set to a screen as the engine does, rendering the instruction set can include creating a new geometry that conforms to all applicable three-dimensional printing requirements, for example, those shown in Table 1.

The printable file rendered from the instruction set can be output, loaded, and processed using, for example, the control circuitry 210, programmable processors 220, and executable control software 230. That is, the new geometry and all of the newly composited high resolution texture maps that were created can be saved, and the three-dimensional structure and objects can be printed, for example, by the printer 270, accordingly.

FIG. 1 is a flow diagram of a novel exemplary method 100 for creating an instruction set for three-dimensionally printing a structure. As seen in FIG. 1, an image of a three-dimensional structure can be provided as in 110. For example, the image can be provided or displayed on the viewing screen 250 of the user interface device 240. Then, user customization instructions can be received for placing objects on the structure as in 120. For example, user customization instructions can be received via input mechanisms 260 of the user interface device 240.

An instruction set can be created as in 130. For example, the control circuitry 210, programmable processors 220, and executable control software 230 can create the instruction set, which can be based on the user-customized image. In some embodiments, the instruction set created as in 130 can include creating an instruction set from the geometry that is used by the control circuitry 210, programmable processors 220, and executable control software 230 to display an image of the structure on the user interface device 240.

As shown in FIG. 1, creating the instruction set as in 130 can include creating a list of core geometry as in 132 and creating a hierarchical skeleton as in 134. The list of core geometry can include properties associated with an image of the structure, properties associated with an image of offset structures, for example, the background, and properties associated with an image of the objects. These properties can include rotation, position, scale, and color values. As explained above, in novel systems and methods, the position and scale of the image of the objects can be stored in a normalized UV space.

After the instruction set is created as in 130, for example, after user customization is complete, the instruction set can be rendered into a printable file as in 140. For example, the control circuitry 210, programmable processors 220, and executable control software 230 can render, that is, convert or format, the instruction set created as in 130 into a printable file that identifies geometry that can be used by a printer to print a three-dimensional structure corresponding to the image provided as in 110. Thus, the instruction set that is used to create the image of the three-dimensional structure as in 110 is not the same file that is used to print a physical three-dimensional structure as in 160. As noted above, the instruction set in some embodiments is a file size that is approximately 10,000 times smaller than the print file used by the three-dimensional printer. The difference in file size is possible in part because the instruction set does not include, but instead references or looks-up, the geometry, color, texture, pattern, etc. of the objects added by the user to the structure.

After the instruction set is rendered into a printable file as in 140, the printable file can be output and processed as in 150. For example, in some embodiments, the control circuitry 210, programmable processors 220, and executable control software 230 can process the instruction set and output the printable file to the printer 270. Finally, the printer 270 can print a three-dimensional structure and objects thereon as in 160 using the printable file that was created as in 140

Although a few embodiments have been described in detail above, other modifications are possible. For example, the logic flows depicted in FIG. 1 does not require the particular order shown, or sequential order, to achieve desirable results. Other steps may be provided, or steps may be eliminated, from the described flows, and other components may be added to, or removed from, the described systems. Other embodiments may be within the scope of the following claims.

From the foregoing, it will be observed that numerous variations and modifications may be effected without departing from the spirit and scope of the invention. It is to be understood that no limitation with respect to the specific system or method illustrated herein is intended or should be inferred. It is, of course, intended to cover by the appended claims all such modifications as fall within the spirit and scope of the claims.

What is claimed is:

1. A method comprising:
receiving user input data via a user interface device for customizing an image of a three dimensional structure displayed on the user interface device,
wherein receiving the user input data for customizing the image of the three-dimensional structure includes receiving locations for placing objects on the image of the three-dimensional structure, the customized image of the three-dimensional structure being composed of core geometry;
control circuitry constructing an instruction set for the customized image of the three dimensional structure, and recreating the customized image of the three-dimensional structure for display on the user interface device using the instruction set, as the user input data is received via the user interface device, the instruction set for the customized image including a hierarchical skeleton of the three-dimensional structure, and a list of the core geometry of which the customized image of the three-dimensional structure is composed, and excluding the core geometry; and
control circuitry rendering the instruction set into a printable file having a computer-aided design (CAD) file format usable by a three-dimensional printer, rendering of the instruction set including creation of new geometry that conforms to one or more three-dimensional printing requirements.

2. The method of claim 1 wherein the receiving locations for placing objects on the image of the three-dimensional structure includes receiving locations for placing decals on the image of the three-dimensional structure.

3. The method of claim 1 wherein the control circuitry constructing the instruction set includes creating the list of the core geometry of the customized image of the three-dimensional structure.

4. The method of claim 3 wherein creating the list of the core geometry includes creating a list of properties associated with the customized image of the three-dimensional structure.

5. The method of claim 4 wherein creating the list of properties associated with the customized image of the three-dimensional structure includes creating a list of rotation, position, scale, and color values of the customized image of the three-dimensional structure.

6. The method of claim 4 wherein creating the list of properties associated with the customized image of the three-dimensional structure includes creating a list of properties associated with each of the image of the three-dimensional structure, an image of offset structures, and images of objects placed on the image of the three-dimensional structure.

7. The method of claim 6 wherein creating the list of properties associated with the images of objects placed on the three-dimensional structure includes storing at least one of position or scale of each of the images of objects in a normalized UV space.

8. The method of claim 1 further comprising transmitting the printable file to a three-dimensional printer.

9. The method of claim 1 further comprising three dimensionally printing a structure corresponding to the customized image of the three dimensional structure, the structure being three-dimensionally printed from the printable file.

10. A system comprising:
  at least one programmable processor; and
  a non-transitory computer readable medium storing executable control software that, in response to execution by the at least one programmable processor, causes the system to at least:
  receive user input via a user interface device for customizing an image of a three-dimensional structure displayed on the user interface device, wherein the system being caused to receive user input includes being caused to receive locations for placing objects on the image of the three-dimensional structure, the customized image of the three-dimensional structure being composed of core geometry;
  construct an instruction set for the customized image of the three-dimensional structure, and recreate the customized image of the three-dimensional structure for display on the user interface device using the instruction set, as the user input data is received via the user interface device, the instruction set for the customized image including a hierarchical skeleton of the three-dimensional structure, and a list of the core geometry of which the customized image of the three-dimensional structure is composed, and excluding the core geometry; and
  render the instruction set into a printable file having a computer-aided design (CAD) file format usable by a three-dimensional printer, render of the instruction set including creation of new geometry that conforms to one or more three-dimensional printing requirements.

11. The system of claim 10 wherein the system being caused to receive locations for placing objects includes being caused to receive locations for placing decals on the image of the three-dimensional structure.

12. The system of claim 10 wherein the system being caused to construct the instruction set includes being caused to create the list of the core geometry of the customized image of the three-dimensional structure.

13. The system of claim 12 wherein the system being caused to create the list of the core geometry includes being caused to create a list of properties associated with the customized image of the three-dimensional structure.

14. The system of claim 13 wherein the system being caused to create the list of properties includes being caused to create a list of rotation, position, scale, and color values of the customized image of the three-dimensional structure.

15. The system of claim 13 wherein the system being caused to create the list of properties includes being caused to create a list of properties associated with each of the image of the three-dimensional structure, an image of offset structures, and images of objects placed on the image of the three-dimensional structure.

16. The system of claim 15 wherein the system being caused to create the list of properties associated with the images of objects placed on the three-dimensional structure includes being caused to store at least one of position or scale of each of the images of objects in a normalized UV space.

17. The system of claim 10 wherein in response to execution by the at least one programmable processor, the executable control software further causes the system to transmit the printable file to a three-dimensional printer.

18. The system of claim 10 further comprising a three-dimensional printer configured to three-dimensionally print a structure corresponding to the customized image of the three-dimensional structure, the structure being three-dimensionally printed from the printable file.

* * * * *